United States Patent [19]

Streifer et al.

[11] 4,132,960
[45] Jan. 2, 1979

[54] SINGLE LONGITUDINAL MODE GAAS/GAALAS DOUBLE HETEROSTRUCTURE LASER

[75] Inventors: William Streifer, Palo Alto; Donald R. Scifres, Los Altos; Robert D. Burnham, Los Altos Hills, all of Calif.

[73] Assignee: Xerox Corporation, Stamford, Conn.

[21] Appl. No.: 781,612

[22] Filed: Mar. 28, 1977

[51] Int. Cl.² .............................................. H01S 3/19
[52] U.S. Cl. .................................. 331/94.5 H; 357/18
[58] Field of Search ................... 331/94.5 H; 357/17, 357/18

[56] References Cited

U.S. PATENT DOCUMENTS

| | | | |
|---|---|---|---|
| 3,916,339 | 10/1975 | Landany et al. | 331/94.5 H |
| 3,984,262 | 10/1976 | Burnham et al. | 331/94.5 H |
| 4,011,113 | 3/1977 | Thompson et al. | 331/94.5 H |

OTHER PUBLICATIONS

M. Ettenberg et al., "Heterojunction Diodes of (Al-Ga)As-GaAs with Improved Degradation Resistance", Applied Physics Letters, vol. 26, No. 8, 15 Apr. 1975, p. 478.

Primary Examiner—Larry N. Anagnos
Assistant Examiner—James W. Davie
Attorney, Agent, or Firm—Leonard Zalman

[57] ABSTRACT

A heterojunction laser in which single longitudinal mode operation is achieved by heavily doping the active region of the laser. The dopent density should be approximately $10^{19}/cm^3$ when the dopent is zinc. A doping density as heavy as possible should be used when the dopent is germanium or any other acceptor impurity. The heavy doping density of the active region excludes the injection of holes into the active region and that exclusion results in single longitudinal mode operation.

1 Claim, 4 Drawing Figures

SINGLE LONGITUDINAL MODE GAAS/GAALAS DOUBLE HETEROSTRUCTURE LASER

BACKGROUND OF THE INVENTION

Conventional double heterostructure (DH) GaAs/-$Ga_{1-x}Al_xAs$ diode lasers are generally observed to lase in several longitudinal modes simultaneously. Since each longitudinal mode is at a different wavelength this type of laser is not as useful as it might be in some applications, were its output single longitudinal mode. Specifically, all applications requiring coherence such as, for example, holography could be carried out with a single longitudinal mode diode laser, but not one operating multiple longitudinal mode. In addition, all optical communications applications including fiber optics are far better fulfilled by a single longitudinal mode laser.

Previous techniques for obtaining single longitudinal mode operation involve using wavelength selective elements either within or external to the laser. Gratings have been used internally (distributed feedback), at the ends (distributed Bragg reflection), and completely externally in conjunction with an anti-reflection coating on the crystal facet. Other techniques also use external frequency selective elements, but all of the above are difficult to implement, or are not viable economically, or increase the overall device size prohibitively, or degrade the operational diode lifetime. Thus, a simple solution to providing single longitudinal mode operation is needed.

OBJECTS OF THE INVENTION

An object of the invention is to provide a heterojunction laser which will lase in a single longitudinal mode.

Another object of the invention is to provide a heterojunction laser which will lase in a single longitudinal mode without using wavelength selective elements and without using external frequency selective elements.

SUMMARY OF THE INVENTION

A heterojunction laser in which single longitudinal mode operation is achieved by heavily doping the active region of the laser. The dopent density should be approximately $10^{19}/cm^3$ when the dopent is zinc. A doping density as heavy as possible should be used when the dopent is germanium or any other acceptor impurity. The heavy doping density of the active region excludes the injection of holes into the active region and that exclusion results in single longitudinal mode operation.

DETAILED DESCRIPTION OF THE INVENTION

Figure 1:
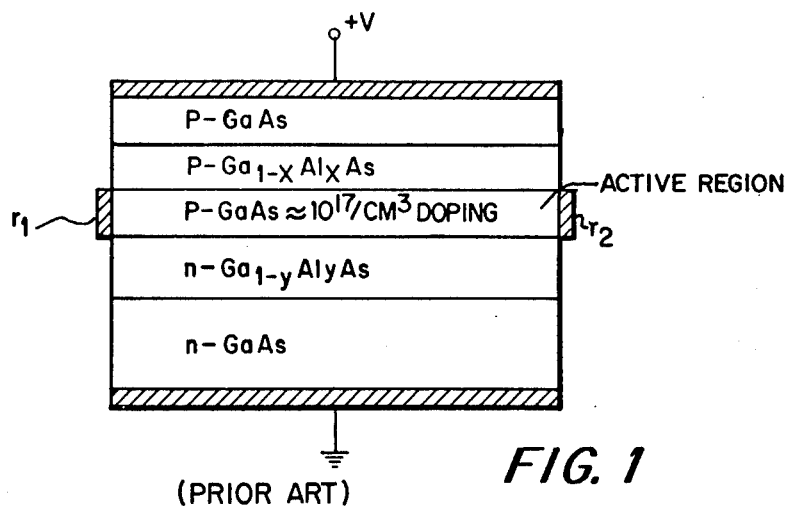
FIG. 1 is a view of a conventional heterostructure laser.

Basically, multiple longitudinal mode operation is caused by axial spatial gain inhomogeneity directly related to low injected hole mobility. In a conventional heterojunction laser comprised of an n-type GaAs substrate, an n-type $Ga_{1-y}Al_yAs$ region doped to a density of approximately $5 \times 10^{17}/cm^3$, a p-type GaAs active region doped with germanium to a doping density of approximately $10^{17}/cm^3$, a p-type $Ga_{1-x}Al_xAs$ region doped to a density of approximately $5 \times 10^{17}/cm^3$, and a p-type GaAs layer (see FIG. 1), when the rectifying junction is sufficiently forward biased by source V electrons are injected across the rectifying junction from the n-$Ga_{1-y}Al_yAs$ region into the active region and simultaneously holes are injected from the p-$Ga_{1-x}Al_xAs$ region into the active region. This injection is essentially uniform along the laser length. The reflective surfaces $r_1$ and $r_2$ provide a resonant cavity which provides stimulated mode (laser) operation. One of the reflective surfaces is partially transmissive to provide for exit of an output light beam. Consider now the standing optical wave pattern of a single longitudinal mode (see FIG. 3). At the antinodes where the field is very intense the injected electrons and injected holes are stimulated to recombine and provide gain for a first longitudinal mode. The injected electrons and injected holes at the nodes are not stimulated to recombine and therefore other longitudinal modes with a different number of periods along the length of the laser can use these electrons and holes for gain and so can lase simultaneously with the first longitudinal mode described above. Note that in FIG. 3 a large variation is shown in injected hole and injected electron concentration under the influence of the one mode. This occurs even though the electrons are very mobile since the electrons cannot diffuse axially without pulling the holes along. Thus the effective diffusion constant in this case is the ambipolar diffusion constant which is approximately twice the hole diffusion constant. The diffusion constant of the relatively immobile holes is quite small.

Figure 2:
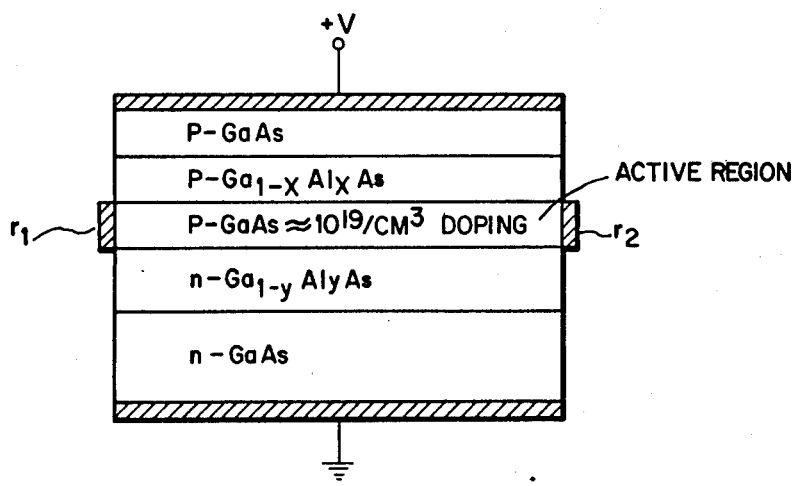
FIG. 2 is a view of a heterostructure laser in accordance with the invention.
Figure 3:
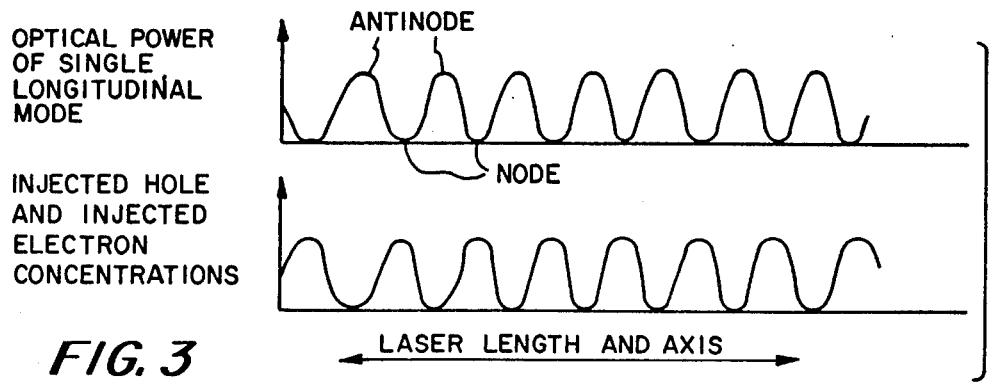
FIG. 3 depicts the standing optical wave pattern of a single longitudinal mode showing optical power, and injected hole and electron concentrations.

To avoid the multiple longitudinal mode operation described above, the active region is doped very heavily p-type, say at approximately $10^{19}/cm^3$ (as shown in FIG. 2). Now, in operation, holes are not injected from the p-$Ga_{1-x}Al_xAs$ region into the active region. Rather, holes are always present in the active region. Thus, when injected electrons combine with holes in the active region new holes are formed almost instantly ($\approx 10^{-12}$ sec) by thermalization. This means that when a single longitudinal mode lases, as shown in FIG. 3, the hole concentration is uniform along the length. Since the electrons diffuse so rapidly axially, those initially at the nodes almost immediately move to smooth out the distribution axially. Those now at the antinodes are used for gain by the first mode until virtually none remain to provide gain for other longitudinal modes.

Figure 4:
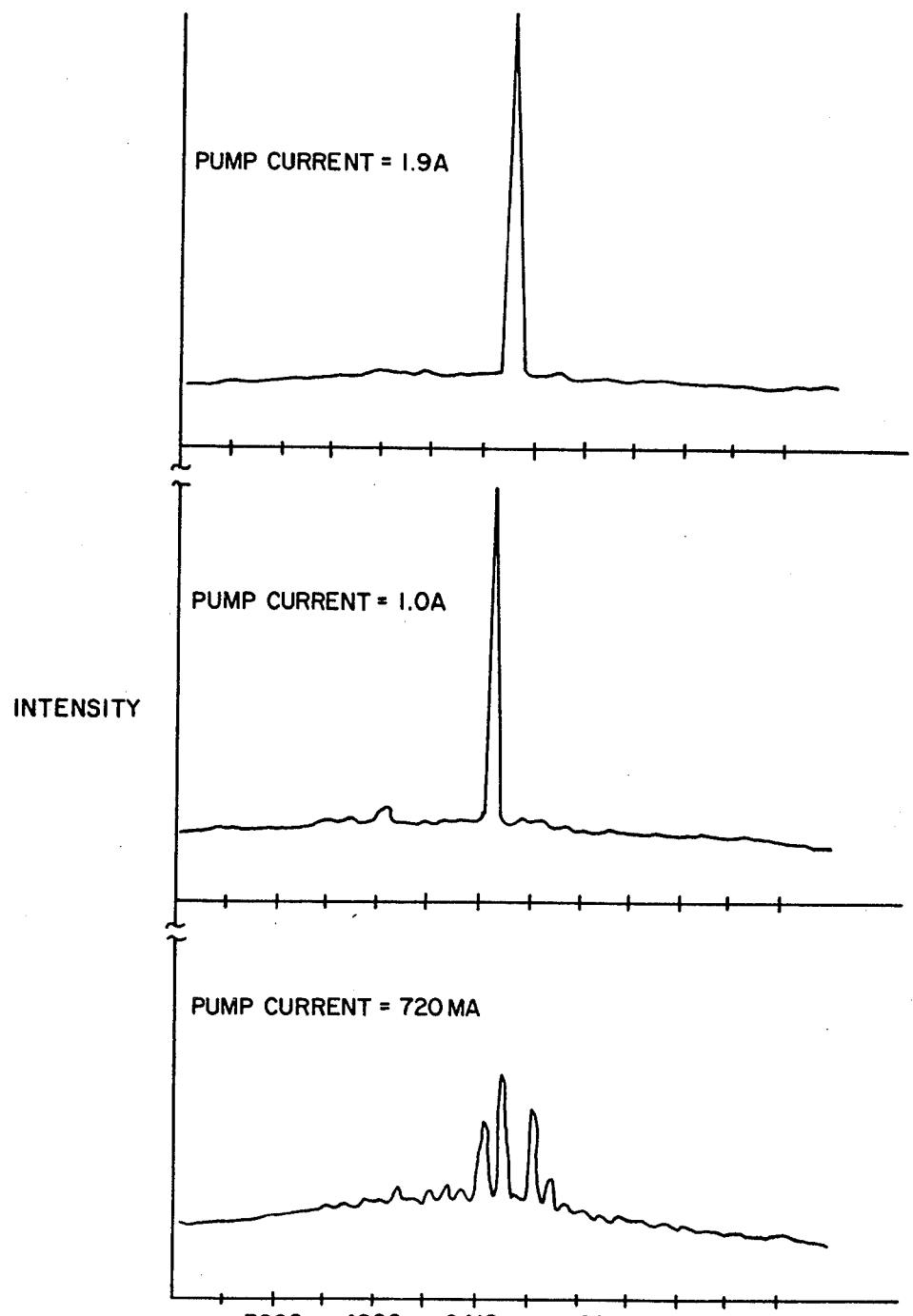
FIG. 4 shows test results for the laser of FIG. 2.

Experimental results with a heavily doped diode as that of FIG. 2 are shown in FIG. 4 at pump currents of 720 ma, 1.0 Amp., and 1.9 Amps. The laser achieved single mode operation at slightly above threshold and remains single mode up to the capacity of its pump which is 2.8 × threshold current.

The dopent for the active region of the laser of FIG. 2 can be zinc. Very heavy doping of the active region can be achieved by doping with germanium or any other acceptor impurity. The regions bordering the active region would be doped to a conventional density, about $5 \times 10^{17}/cm^3$.

We claim:

1. In a solid state, heterostructure diode laser having an active region layer, confinement layers bordering the active region layer, and means for providing a resonant cavity, at least one of the confinement layers having a lower refractive index than the refractive index of the active region layer and one of the confinement layers being doped differently than the active region layer to provide a rectifying junction, the improvement comprising:

restricting the output of the laser when the rectifying junction is sufficiently forward biased to a single longitudinal mode by doping the laser active region with zinc to a doping concentration density of approximately $10^{19}/cm^3$ and doping said confinement layers to a dopent concentration density of approximately $5 \times 10^{17}/cm^3$.

* * * * *